United States Patent [19]

Mikoshiba et al.

[11] Patent Number: 5,262,673
[45] Date of Patent: Nov. 16, 1993

[54] SEMICONDUCTOR ELEMENT

[76] Inventors: Nobuo Mikoshiba, 30-18, Yagiyama-Honcho 2-chome, Taihaku-ku; Kazuo Tsubouchi, 30-38, Hitokita, 2-chome, Taihaku-ku both of, Sendai-shi, Miyagi-ken, Japan

[21] Appl. No.: 665,358
[22] Filed: Mar. 6, 1991
[30] Foreign Application Priority Data Mar. 8, 1990 [JP] Japan .................................. 2-57711

[51] Int. Cl.⁵ .......................................... H01L 23/02
[52] U.S. Cl. .................................. 257/712; 257/714
[58] Field of Search ................ 357/81, 82; 257/712, 257/713, 714, 718, 719, 721, 722

[56] References Cited

U.S. PATENT DOCUMENTS

| | | | |
|---|---|---|---|
| 4,268,850 | 5/1981 | Lazarek et al. | 357/82 |
| 4,620,215 | 10/1986 | Lee | 357/81 |
| 4,644,385 | 2/1987 | Nakanishi et al. | 357/82 |
| 4,758,926 | 7/1988 | Herrell et al. | 361/385 |
| 4,860,444 | 8/1989 | Herrell et al. | 29/840 |
| 4,881,237 | 11/1989 | Donnelly | 372/50 |
| 4,894,709 | 1/1990 | Phillips et al. | 357/82 |
| 5,057,908 | 10/1991 | Weber | 357/81 |

FOREIGN PATENT DOCUMENTS

| | | |
|---|---|---|
| 0194216A1 | 9/1986 | European Pat. Off. . |
| 0228212A2 | 7/1987 | European Pat. Off. . |
| 0241290A1 | 10/1987 | European Pat. Off. . |
| 0368743A2 | 5/1990 | European Pat. Off. . |
| 3110604A1 | 2/1982 | Fed. Rep. of Germany . |

OTHER PUBLICATIONS

2244 Research Disclosure (1989) Nov., No. 307, New York, U.S. No. XP 000084638 30794 Enhanced Air--Cooled Heatsink, p. 856.

"High-Performance Heat Sinking for VLSI" by D. B. Tuckerman and R. F. W. Pease, IEEE Electron Device Letters, vol. EDL-2, No. 5, May, 1981.

Primary Examiner—Frank Gonzalez
Attorney, Agent, or Firm—Flynn, Thiel, Boutell & Tanis

[57] ABSTRACT

A semiconductor element is disclosed, with which it is possible to obtain an area sufficiently large for evacuating heat and to have a high thermal conductivity so as to have an extremely high heat evacuation efficiency by using cooling fins having a microchannel structure.

29 Claims, 16 Drawing Sheets

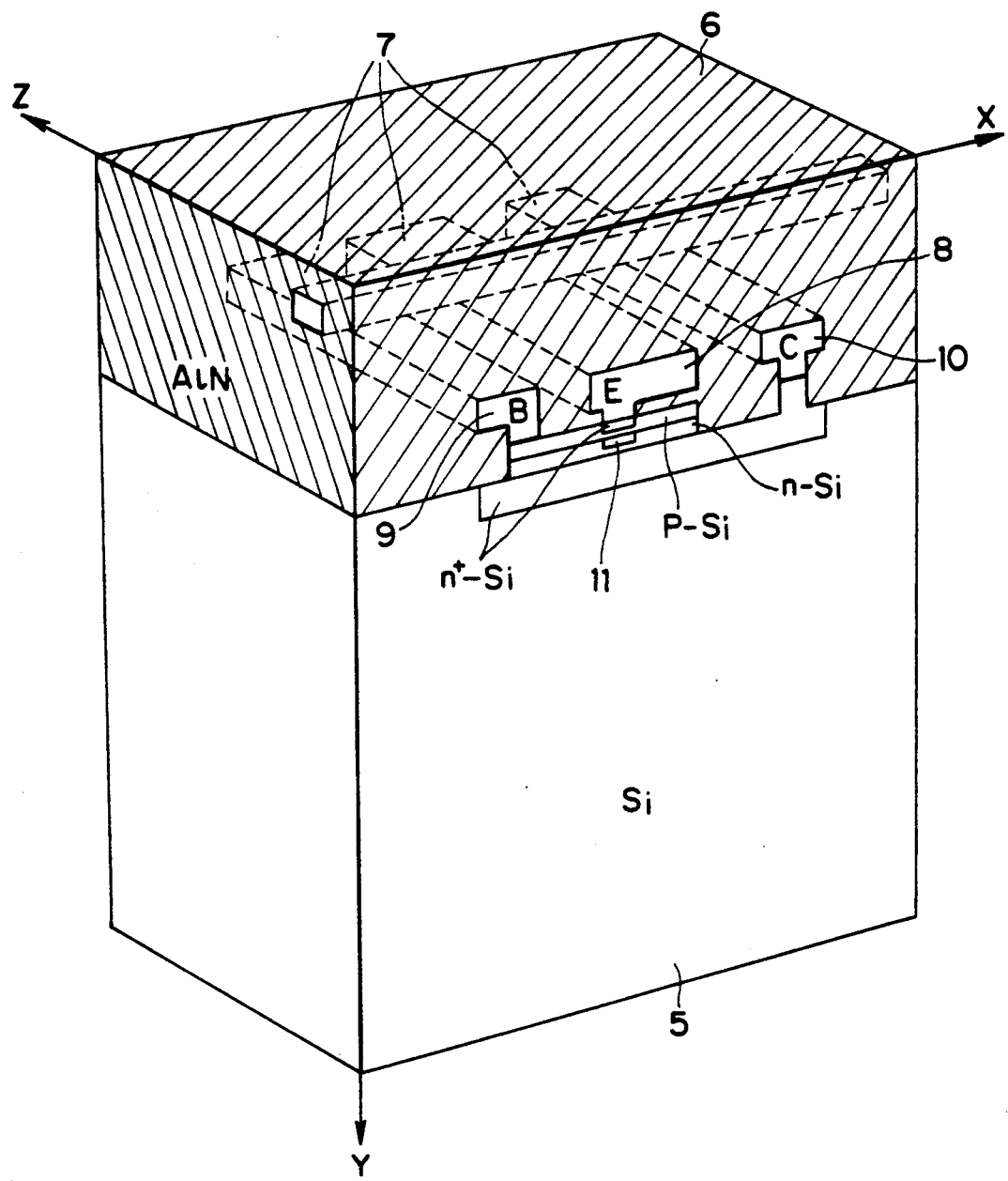

SEMICONDUCTOR ELEMENT

FIELD OF THE INVENTION

The present invention relates to a semiconductor element, with which an ultra high speed and ultra high integration density electronic circuit can be realized, owing to the fact that heat produced in semiconductor is evacuated rapidly to the exterior through cooling fins having a microchannel structure.

BACKGROUND OF THE INVENTION

In semiconductor integrated circuits the integration density becomes high and higher, accompanied by demand for an ultra high speed and an ultra high integration density. Already at present, the integration density for integrated circuits consuming a large amount of electric power because of high speed drive is being limited by the limit of heat evacuation.

However electric power consumption per chip is increased rapidly, accompanied by demand for increasing the performance and the speed of semiconductor circuits. Almost all consumed electric power is transformed into heat and produced heat raises the temperature of a whole chip, which causes deterioration in characteristics of elements and lowering in reliability.

However, by the cooling technique using a present structure, heat evacuation is about 30W/cm$^2$ by water cooling and a new technique for removing rapidly heat produced within a semiconductor chip to the exterior is required. In a prior art heat current circuit for heat evacuation, the part, at which heat conducting characteristics are the worst, is a heat conducting portion from a wall of solid to cooling medium (air, water).

FIG. 15 represents a heat current circuit in an integrated circuit by the prior art technique, using heat resistance and heat capacity. The figure represents a heat current circuit in an integrated circuit having e.g. a chip thickness of about 500 μm and a chip size of about 1 cm$^2$ and the meaning of Rf, Rp, Cp, Rsi, Csi and Rb is as follows:

Rf: heat resistance to heat conduction from the front side of the chip,
Rp: heat resistance to heat conduction in a passivation film on the front side of the chip (thickness of about 5 μm),
Cp: heat capacity of the passivation film (negligible in a stationary state),
Rsi: heat resistance to heat conduction in an Si substrate (thickness of about 494 μm),
Csi: heat capacitance of the Si substrate (negligible in a stationary state), and
Rb: heat resistance to heat conduction from the front side of the chip.

FIGS. 16A and 16B show a concrete example of an equivalent circuit of a heat current circuit in a stationary state, in the case where the passivation film used by the prior art technique is made of SiO$_2$, FIG. 16A representing a case where the front surface is cooled by natural convection and the rear surface by forced air cooling, FIG. 16B representing a case where the front surface is cooled by natural convection and the rear surface by water cooling. In the stationary state heat capacity can be neglected. Representative experimental values of the prior art technique are used for boundary conditions and the heat resistances converted from heat conductivity by force air cooling=0.2W/cm$^2$·K, heat conductivity by water cooling=1W/cm$^2$·K and heat conductivity by natural convection=1×10$^{-3}$W/cm$^2$·K are indicated.

As clearly seen from FIGS. 16A and 16B, by the prior art heat evacuating technique, although within the solid of the semiconductor chip the heat resistance is sufficiently low, order of 10$^{-2}$K/W, the heat resistance to the cooling medium is about 5K/W by forced air cooling and about 1K/W by water cooling, which are higher by almost 2 orders of magnitude than that obtained for the solid.

Further e.g. D. B. Tuckerman and F. Pease (IEEE Electron Device Lett., Vol. EDL-2, No. 5, pp 126–129, May 1981, "High Performance Heat Sinking for VLSI") have indicated that it is possible to deal with an extremely high heat production density by forming microchannels of about 50 μm×300 μm in a comb shape directly on the rear surface of the Si substrate, through which water is made flow.

However, by this method, since the microchannels are formed by processing directly the Si substrate, there are a number of problems in the fabrication from the practical point of view.

As described above, by the prior art heat evacuating technique, since the heat resistance from the cooling fins to the cooling medium is too high, the cooling fins cannot effect heat evacuation with a high efficiency.

Further, by the method, by which the microchannels are formed in the silicon substrate, there is a problem in the fabrication in practice.

OBJECT OF THE INVENTION

The object of the present invention is to reduce remarkably the heat resistance to the cooling medium by disposing microchannel type fins, which can be easily fabricated in practice.

SUMMARY OF THE INVENTION

In order to achieve the above object, the present invention is characterized in that fins having a microchannel structure, in which a plurality of microchannel flow paths are formed, are bonded to a semiconductor chip.

In order to increase the quantity of evacuated heat or to improve the cooling efficiency, it is necessary primarily to secure a sufficiently large surface area at the contact surface with cooling medium for heat evacuation or cooling and secondly to increase as far as possible the heat conductivity within the limit imposed by the state of use of cooling medium.

Since the cooling fins according to the present invention have a microchannel structure, it has a high heat conductivity, a large surface area can be formed in a small size therewith, and it can be fabricated easily.

BRIEF DESCRIPTION OF THE DRAWINGS

FIG. 9 is a scheme indicating an embodiment of a bipolar transistor having a heat diffusing structure according to the present invention;

DETAILED DESCRIPTION

Figure 1:
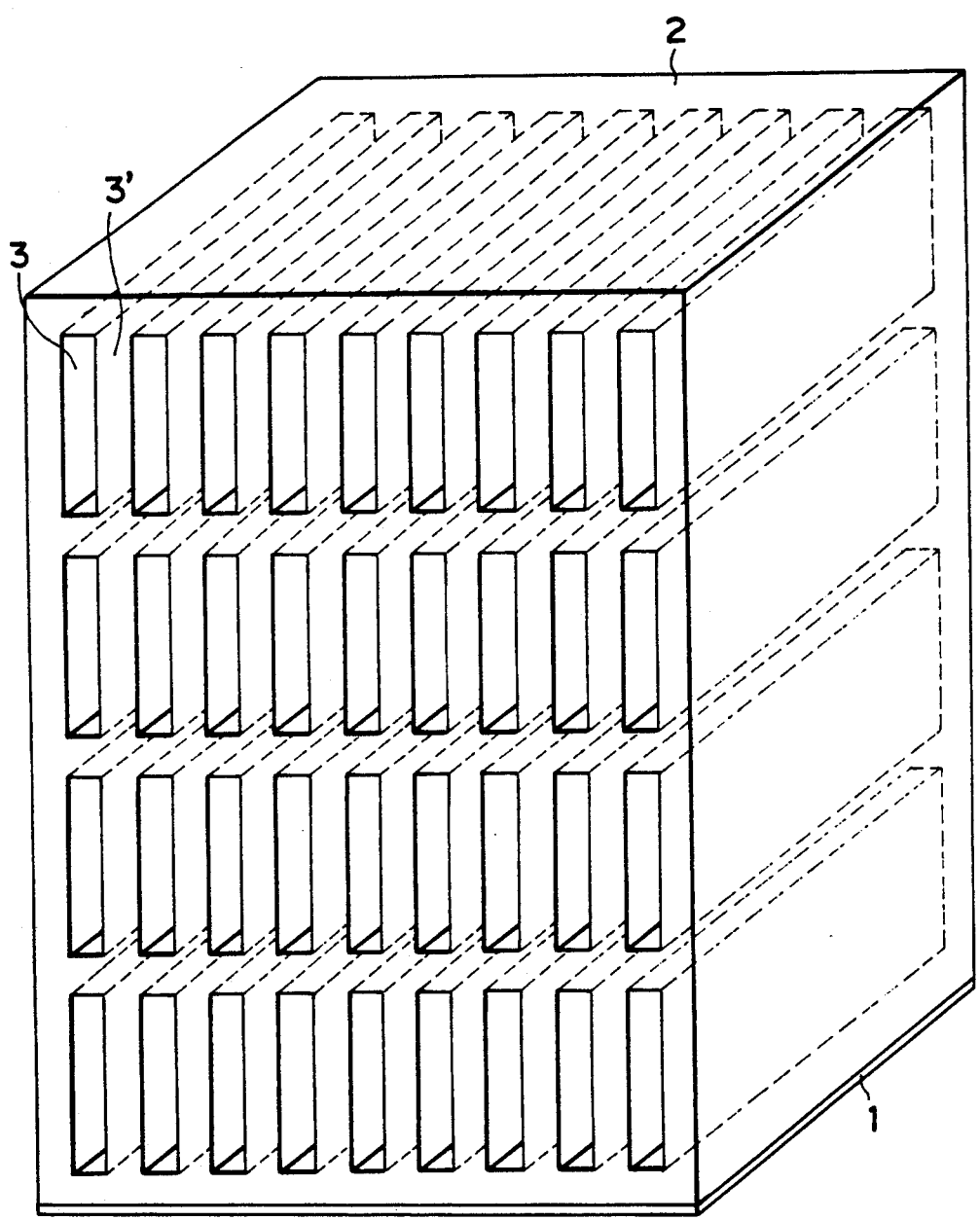
FIG. 1 is a scheme showing an embodiment of the construction of fins having a microchannel structure according to the present invention and a semiconductor chip jointed thereto by the direct bonding method.

Hereinbelow several preferred embodiments of the present invention will be explained, referring to the drawings.

FIG. 1 shows an embodiment of fins having a microchannel structure according to the present invention. In the figure, reference numeral 1 is a semiconductor chip; 2 indicates fins having a microchannel structure; and 3 represents microchannel flow paths. Although the size and the number of stages of the flow paths in the fins having a microchannel structure 2 are determined, depending on the object, a good result is obtained, when the size is small in a practically usable domain and the number of stages is great. FIG. 1 shows a structure, in which microchannels serving as flow paths for cooling medium are arranged in 4 stages in the vertical direction. The cross section of each of the flow paths 3 for cooling medium is about 50 $\mu m \times 250$ $\mu m$ and the length thereof is about 1 cm. The flow paths are sectioned by a wall 3' about 50 $\mu m$ thick. The fins having a microchannel structure 2 can be made of any material, if it has a high thermal conductivity. However, Al, Al alloys, Cu, Cu alloys, etc. among metals and AlN, BN, etc. among insulating materials are found suitable. Water, compressed air and fleon are suitable for the cooling medium and liquid nitrogen, liquid helium, etc. are suitable for the cryogenic drive. However it is found that water and compressed air, which can be used in a simple manner, are the most suitable. Although a better effect can be obtained with decreasing temperature of the cooling medium, from the point of view of the simplicity a temperature from about 5° C. to about 25° C. is preferable in practice.

In the present embodiment the semiconductor chip 1 and the fins having a microchannel structure 2 are bonded with each other by the direct bonding technique.

TABLE 1 indicates the thermal conductivity of the flow in a tube having the cross section of about 50 $\mu m \times 250$ $\mu m$ as described above and the pressure loss when the cooling medium flows through the tube about 1 cm long, in the case where the flow in the tube in the microchannels is water of 10° C., water of 17° C., air of 5° C. and air of 17° C.

TABLE 1

Thermal conductivity of flow in tube and pressure loss (a) in the case where cooling medium is water

| Temperature (°C.) | Flow Speed (m/s) | Thermal Conductivity (W/cm².°C.) | Pressure Loss (kgf/cm²) |
| --- | --- | --- | --- |
| 10 | 6 | 2.40 | 3.7 |
| 10 | 15 | 3.69 | 9.6 |
| 17 | 6 | 2.40 | 3.1 |
| 17 | 15 | 3.74 | 8.3 |

(b) in the case where cooling medium is air

| Temperature (°C.) | Pressure (kgf/cm²) | Flow Speed (m/s) | Thermal Conductivity (W/cm².°C.) | Pressure Loss (kgf/cm²) |
| --- | --- | --- | --- | --- |
| 5 | 1.0 | 5 | $1.20 \times 10^{-19}$ | 0.04 |
| 5 | 1.0 | 24 | $1.60 \times 10^{-5}$ | 0.20 |
| 5 | 5.1 | 24 | $1.70 \times 10^{-2}$ | 0.20 |
| 17 | 1.0 | 5 | $4.50 \times 10^{-21}$ | 0.04 |
| 17 | 1.0 | 24 | $8.5 \times 10^{-6}$ | 0.20 |
| 17 | 5.1 | 24 | $1.5 \times 10^{-2}$ | 0.20 |

As clearly seen from TABLE 1, the thermal conductivity indicating the cooling capacity is very low for air in the neighborhood of the normal pressure (pressure of 1 kgf/cm²). Consequently, in the present embodiment, liquid or water, for which the pressure loss in tube is lower than about 10 kgf/cm², or compressed gas or compressed air, for which the pressure loss in tube is lower than about 0.5 kgf/cm², is used. A better result can be obtained with increasing flow speed of the cooling medium. However, in practice, the flow speed as high as possible, which can be obtained with a pressure loss in tube under the value described above, is found to be suitable.

Figure 2:
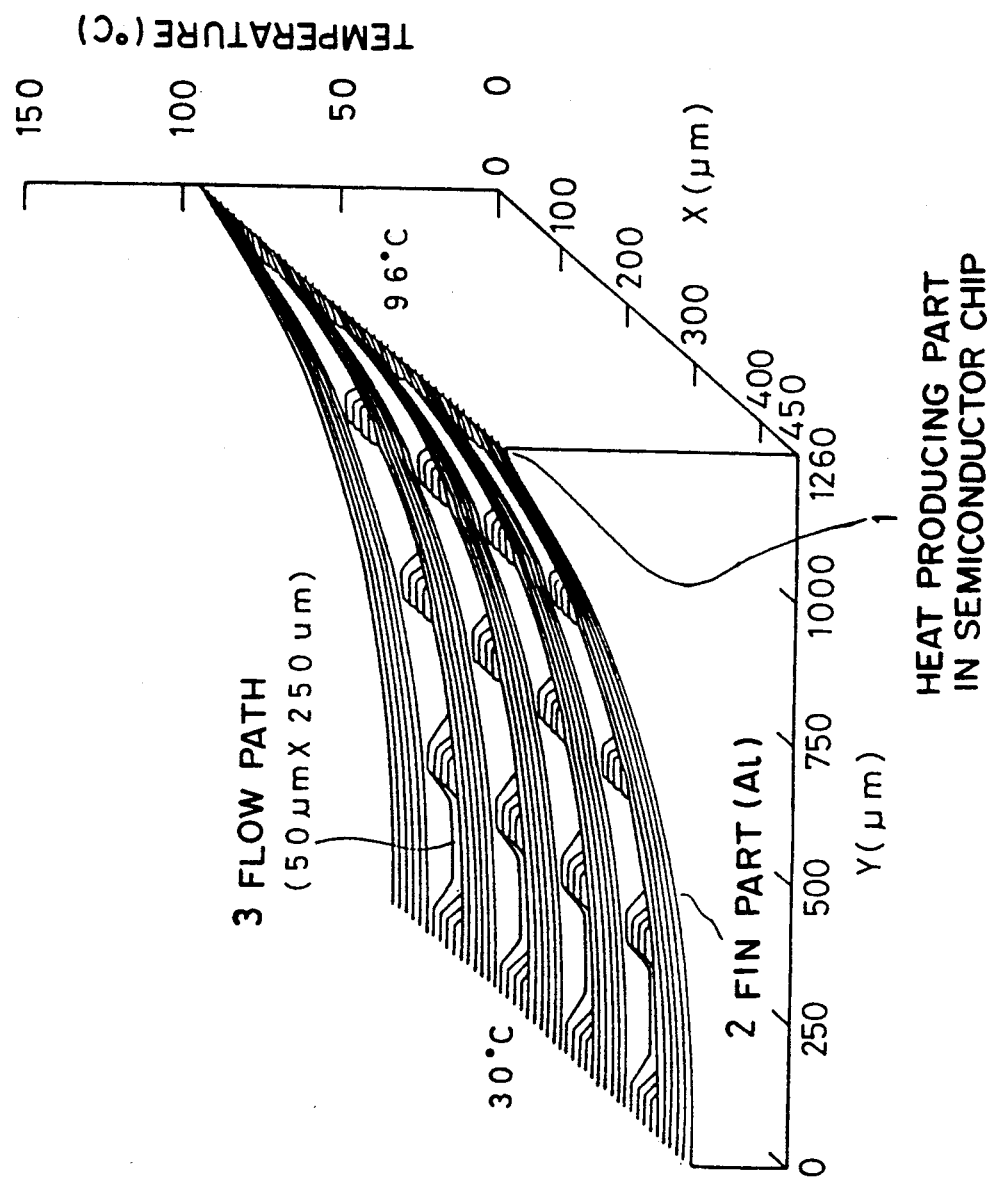
FIG. 2 is a scheme indicating an example of the temperature distribution in the fins having a microchannel structure and the semiconductor chip jointed thereto by the direct bonding method using water cooled aluminum.

FIG. 2 indicates a case as a mode of realization of the present embodiment, where the cooling medium is water of about 17° C.; the flow speed thereof is about 6 m/s; heat produced at the surface of the semiconductor chip is about 2 kW/cm²; and the fins having a microchannel structure are made of Al. Although a part of the semiconductor chip and the fins is indicated, it can be considered as a representative temperature distribution representing the whole.

As described above, in spite of a heat production as great as about 2 kW/cm$^2$ at the surface of the semiconductor chip, the temperature of the semiconductor chip is kept at about 96° C. Since semiconductor chip such as LSI are used usually at a junction temperature below 125° C., the value of about 96° C. described above represents a temperature usable in practice.

Figure 3:
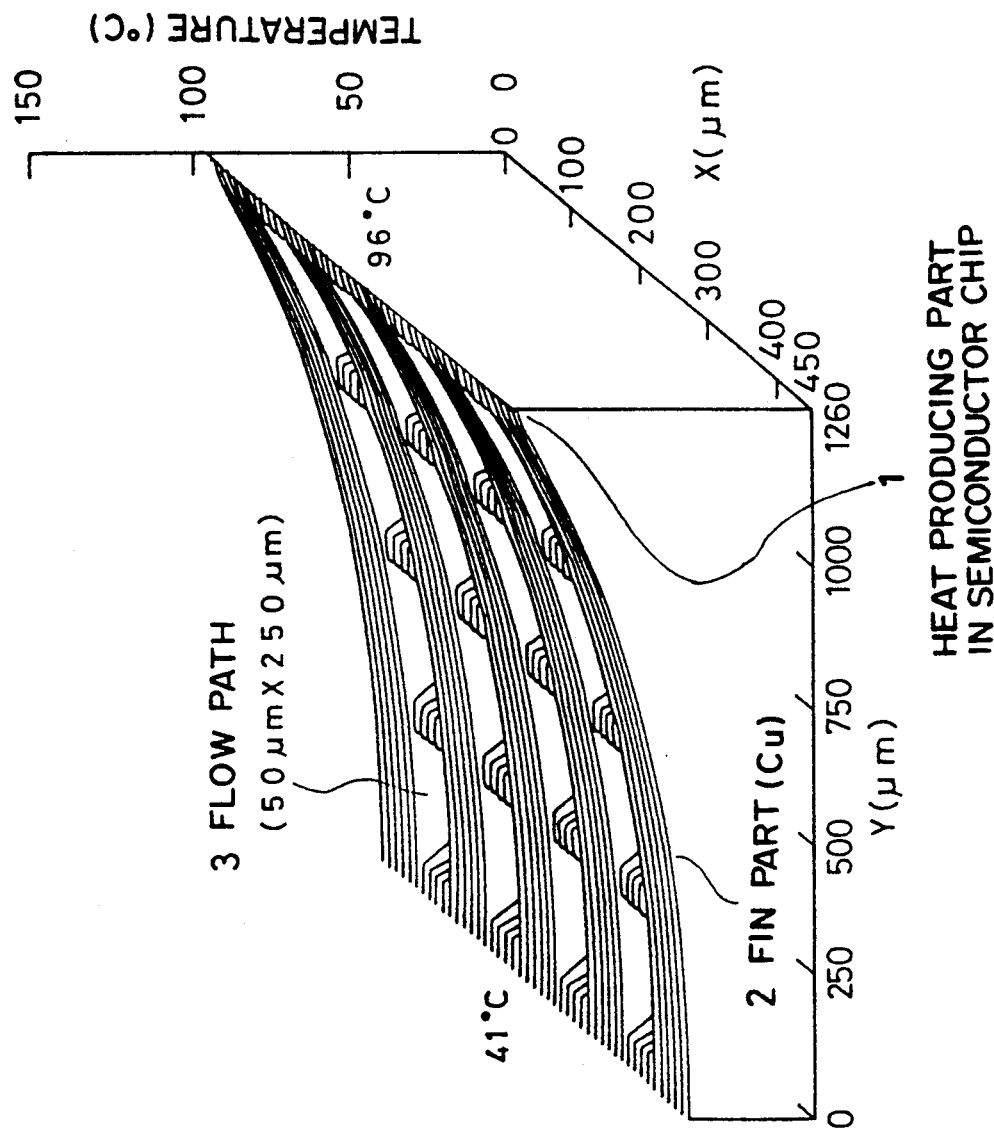
FIG. 3 is a scheme indicating an example of the temperature distribution in the fins having a microchannel structure and the semiconductor chip jointed thereto by the direct bonding method using water cooled direct bonding method using water cooled copper.

FIG. 3 indicates a case where Al is changed into Cu for the material for the fins having a microchannel structure as another mode of realization of the embodiment indicated in FIG. 1. The other conditions are identical to those used for the example indicated in FIG. 2. Although the flow speed of water of 17° C. serving as the cooling medium is about 6 m/s, even for a heat production of about 2.5 kW/cm$^2$ at the surface of the semiconductor chip, the temperature of the semiconductor chip is kept at about 96° C. owing to the fact that the material is changed into Cu.

In the modes of realization indicated in FIGS. 2 and 3, the semiconductor chip is a semiconductor single element or an integrated circuit of MOS transistors, bipolar type transistors, semiconductor lasers, light emitting diodes, etc. and the effect is obtained for all of them.

Figure 4:
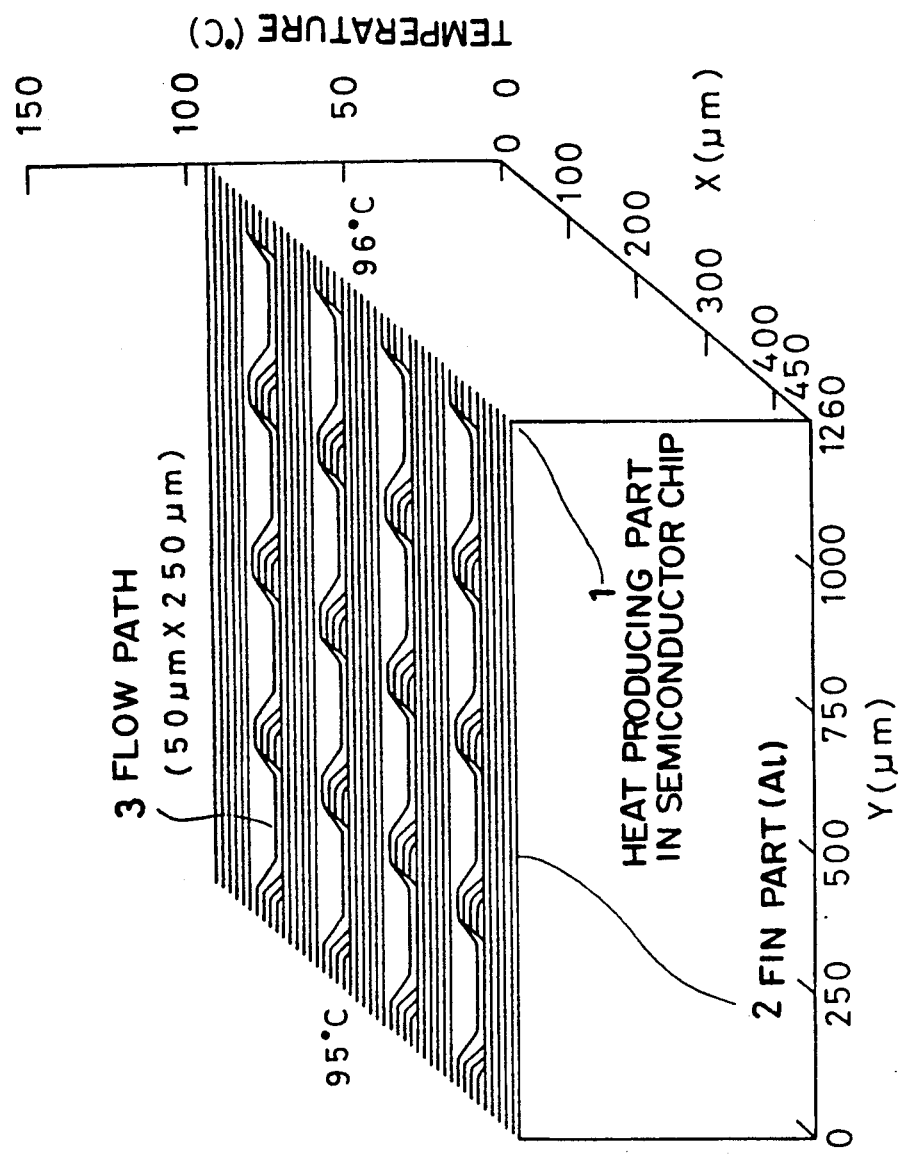
FIG. 4 is a scheme indicating an example of the temperature distribution in the fins having a microchannel structure and the semiconductor chip jointed thereto by the air cooled direct bonding method.

FIG. 4 shows an embodiment in the case where compressed air is used for the cooling medium. Compressed air of about 17° C. (pressure=about 5 kgf/cm$^2$) flows through the tube 3 of the microchannels with a flow speed of about 24 m/s and the fins having a microchannel structure are made of Al. When the heat production at the surface of the semiconductor chip is about 30W/cm$^2$, the temperature at the surface of the semiconductor chip is kept at about 96° C. Although the heat evacuation efficiency is fairly low with respect to that obtained by water cooling, it is remarkably higher than that obtained by usual forced air cooling. When Al is changed into Cu for the material for the fins having a microchannel structure, no great difference as found in the case of water cooling is observed. This is because the heat conduction rate from the cooling medium to air is small, i.e. the heat resistance is great, and the heat resistance to air is considerably greater than the heat resistance due to the heat conduction through the solid of the fins, so that the difference in the solid material of the fins does not influence thereon. Consequently the material of the fins is not limited to Al and Cu, but any material may be used, if it is a solid material.

The semiconductor chip is a single element or an LSI of heat producing semiconductor elements, as described previously, and the effect can be obtained for all of them.

TABLE 2

Heat resistance and equivalent thermal conductivity of fins having microchannels (per 1 cm$^2$ of area)

| Temperature of Water (°C.) | Flow Speed (m/s) | Material of Fins | Heat Resistance (°C./W) | Equivalent Thermal Conductivity (W/cm$^2$·°C.) |
|---|---|---|---|---|
| (a) Water cooling | | | | |
| 17 | 6 | Al | 0.039 | 25.6 |
| | | Cu | 0.031 | 32.0 |
| | 15 | Al | 0.031 | 32.2 |
| | | Cu | 0.024 | 41.0 |
| 10 | 6 | Al | 0.039 | 25.3 |
| | | Cu | 0.032 | 31.5 |
| | 15 | Al | 0.032 | 31.5 |
| | | Cu | 0.025 | 40.5 |
| (b) Air cooling | | | | |

TABLE 2-continued

Heat resistance and equivalent thermal conductivity of fins having microchannels (per 1 cm$^2$ of area)

| Temperature of Water (°C.) | Flow Speed (m/s) | Material of Fins | Heat Resistance (°C./W) | Equivalent Thermal Conductivity (W/cm$^2$·°C.) |
|---|---|---|---|---|
| 17 | 24 | Al.Cu | 2.63 | 0.38 |
| 5 | 24 | Al.Cu | 2.37 | 0.42 |

TABLE 2(a) indicates numerical values of the heat resistance (° C./W) and the equivalent thermal conductivity (W/cm$^2$·° C.) per 1 cm$^2$ of area viewed from the surface of the semiconductor chip connected with the surface of the fins, when the temperature of water, the flow speed and the material of the fins are varied, in the case of water cooling in the different modes of realization described above.

In this TABLE, e.g. a heat resistance of about 0.025° C./W is obtained, when the cooling medium is viewed from the surface of the semiconductor chip, in the case where fins having a microchannel structure (4 stage type) made of Cu are used and water having a temperature of 10° C. is made flow with a flow speed of about 15 m/s.

This means that, when the heat production at the surface of the semiconductor chip is 100 W/cm$^2$, the temperature rise is kept at about 2.5° C. from 10° C. If the temperature rise of the semiconductor chip from 10° C. should be maintained at about 85° C., a heat production of about 3400 W/cm$^2$ at the surface of the semiconductor chip is allowable. Further, in this TABLE, e.g. a heat resistance of about 0.039° C./W is obtained, when the cooling medium is viewed from the surface of the semiconductor chip, in the case where fins having a microchannel structure (4 stage type) made of Al are used and water having a temperature of 17° C. is made flow with a flow speed of about 6 m/s. For example, when the heat production at the surface of the surface of the semiconductor chip is about 100 W/cm$^2$, the temperature rise is kept at about 4° C. If the temperature rise of the semiconductor chip should be maintained at about 85° C., a heat production of about 2180 W/cm$^2$ at the surface of the semiconductor chip is allowable.

TABLE 2(b) indicates numerical values obtained for the heat resistance (° C./W) and the quivalent thermal conductivity (W/cm$^2$·° C.) per 1 cm$^2$ of area, when the cooling medium is viewed from the surface of the semiconductor chip connected with the surface of the fins and the temperature of air, the flow speed and the material of the fins area varied, in the case of air cooling in the different modes of realization described above.

In this TABLE, e.g. a heat resistance of about 2.63° C./W is obtained, when the cooling medium is viewed from the surface of the semiconductor chip, in the case where fins having a microchannel structure (4 stage type) made of Al are used and compressed air (about 5 kgf/cm$^2$) having a temperature of 17° C. is made flow with a flow speed of about 24 m/s. For example, when the heat production in the semiconductor chip is about 1W/cm$^2$, the temperature rise from 17° C. is kept at 2.7° C. Further, if the temperature rise of the semiconductor chip from 17° C. should be maintained at about 85° C., a heat production of about 32W/cm$^2$ at the surface of the semiconductor chip is allowable. In the case of the air cooling result obtained by using Cu for the material for the fins are almost identical to those obtained by using Al therefor. Further the effect can be obtained for any single element and LSI as a heat producing semiconductor element, as described previously.

Figure 5:
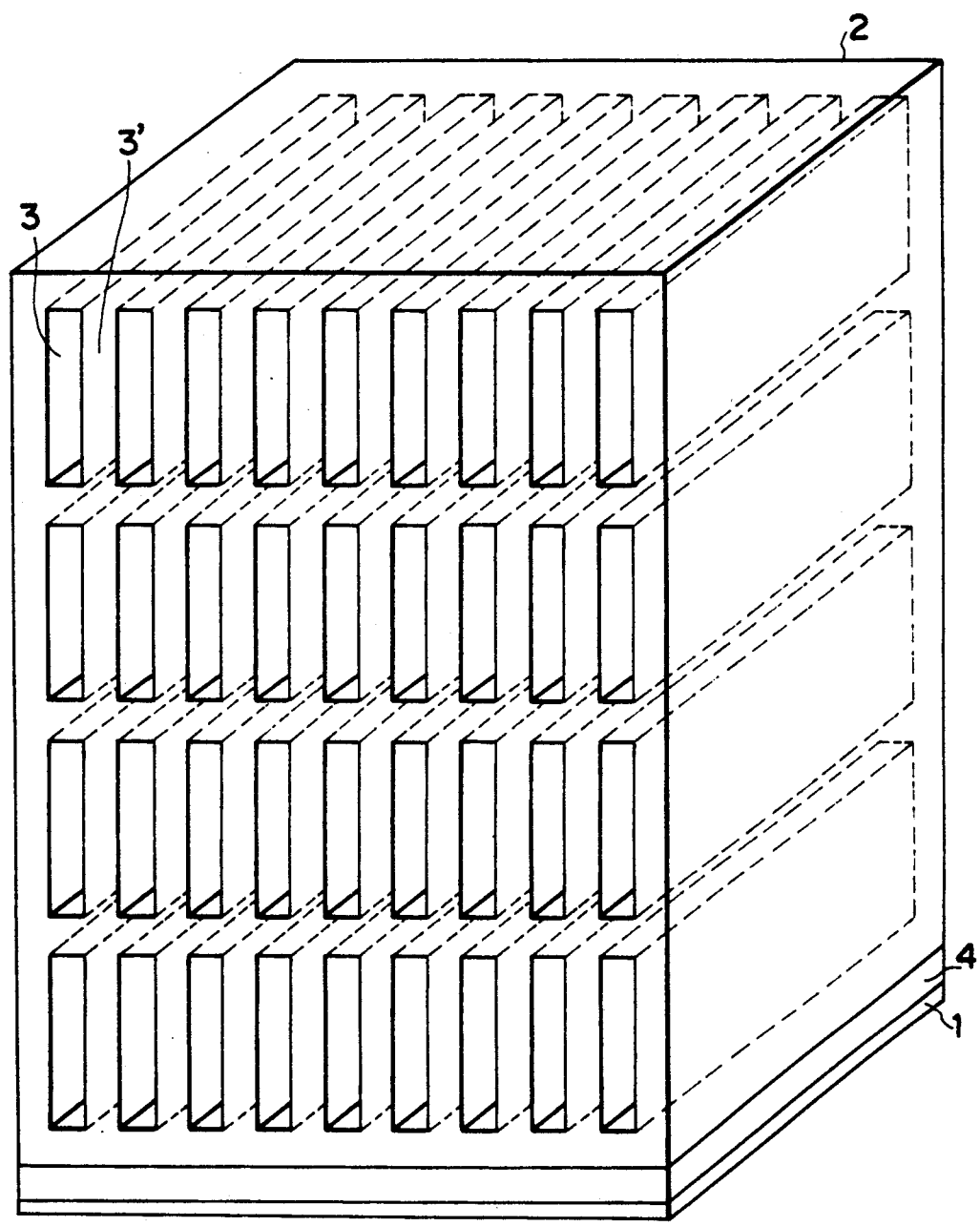
FIG. 5 is a scheme showing an embodiment of the construction of fins having a microchannel structure using a bonding layer according to the present invention and a semiconductor chip.

FIG. 5 shows an embodiment, in which a bonding layer 4 is used between the semiconductor chip 1 and the fins having microchannel structure 2. Stress due to the difference in the thermal expansion between the semiconductor chip and the fins having a microchannel structure can be better alleviated. Low temperature solder, In, Mo, Cu-W alloy, etc. are useful as a material for the bonding layer. Further it is useful also to use a thermally highly conductive and electrically insulating thin film such as AlN, BN, SiC, etc. together therewith. The construction of the fins having a microchannel structure 2 is identical to that used in the embodiment indicated in FIG. 1.

Figure 6:
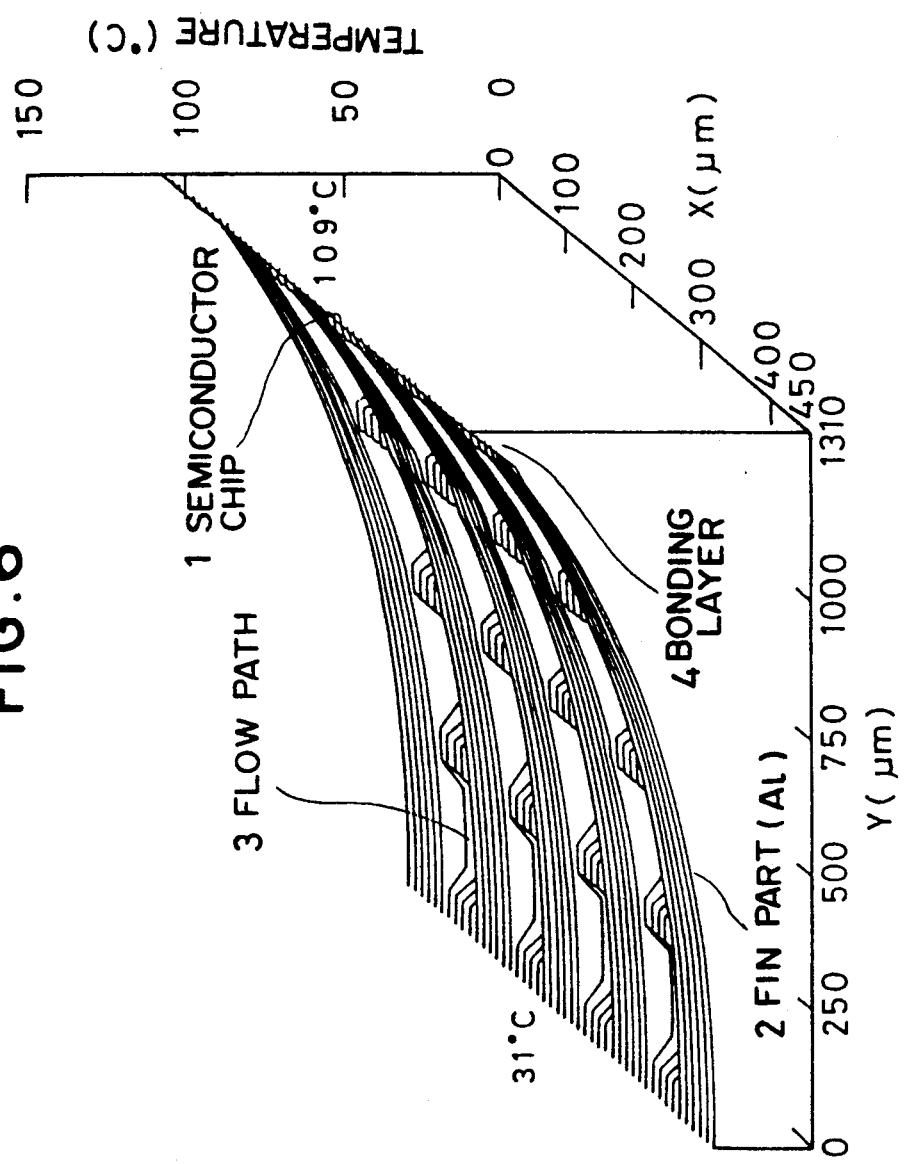
FIG. 6 is a scheme indicating an example of the temperature distribution in the fins having a microchannel structure made of water cooled aluminum using a bonding layer and the semiconductor chip.

FIG. 6 shows a result obtained by using the construction used in the embodiment indicated in FIG. 5, in which In (about 50 μm thick) is used for the bonding layer. It indicates a case where the flow speed of water serving as the cooling medium, having a temperature of 17° C. is about 6 m/s; the heat production at the surface of the semiconductor chip 1 is about 2 kW/cm$^2$; and the fins having a microchannel structure is made of Al. Although, in FIG. 6, the temperature distribution of only a part of area of the semiconductor chip and the fins of about 1 cm$^2$ is indicated, it can be considered as a representative temperature distribution representing the whole.

As described above in spite of a heat production as great as about 2 kW/cm$^2$ at the surface of the semiconductor chip, the temperature at the surface of the semiconductor chip is kept at about 109° C. Although a great temperature gradient is found in the layer of In serving as the bonding layer 4, the magnitude thereof gives rise to no problem in practice.

Figure 7:
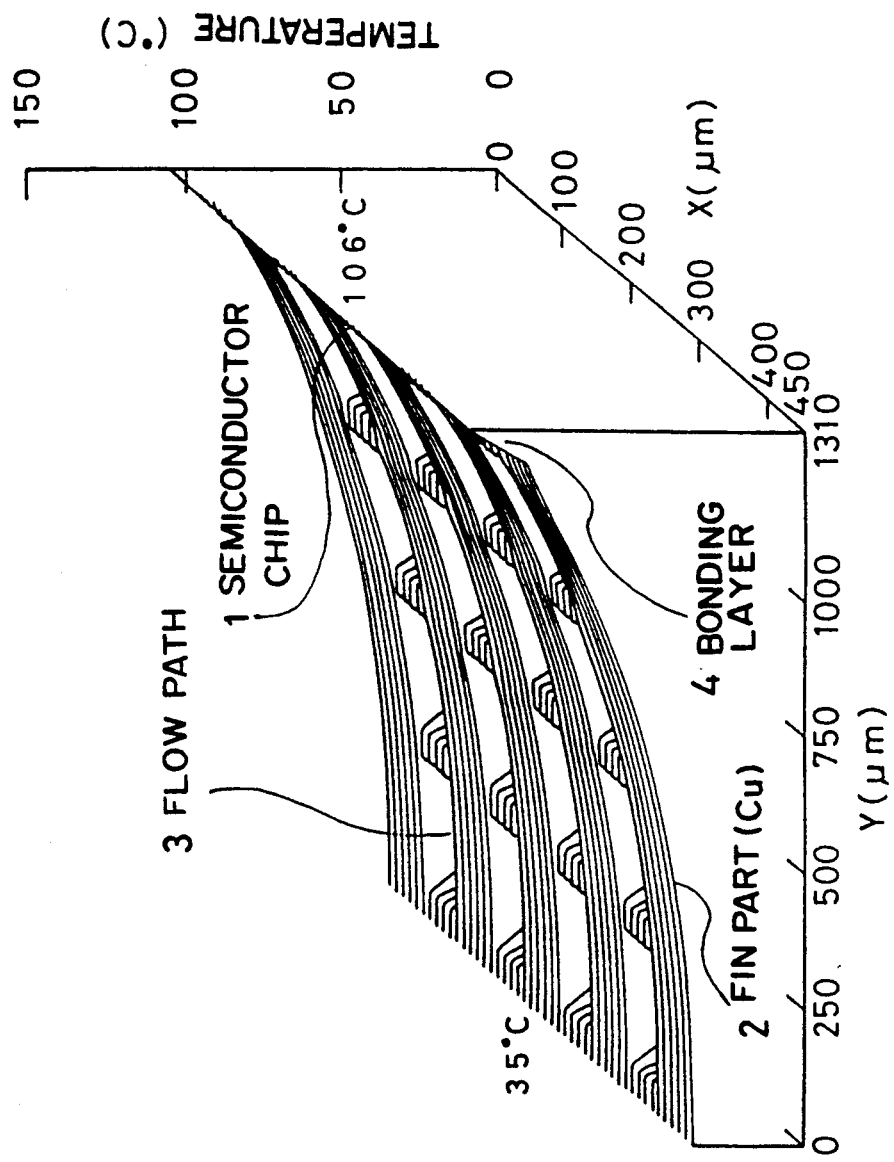
FIG. 7 is a scheme indicating an example of the temperature distribution in the fins having a microchannel channel structure made of water cooled copper using a bonding layer.

FIG. 7 indicates a mode of realization (temperature distribution in the cooling fins), in the case where it differs from the example indicated in FIG. 6 only in that Al is changed into Cu for the material for the fins having a microchannel structure and that the temperature of water serving as the cooling medium is about 10° C., and the other conditions are identical to those used for the example indicated in FIG. 6. In this case, although the heat production at the surface of the semiconductor chip 1 is as great as about 2.5 kW/ cm$^2$, the temperature at the surface of the semiconductor chip is kept at about 106° C. Similarly to the preceding example, although a great temperature gradient is found in the layer of In serving as the bonding layer 4, the magnitude thereof gives rise to no problem in practice.

Figure 8:
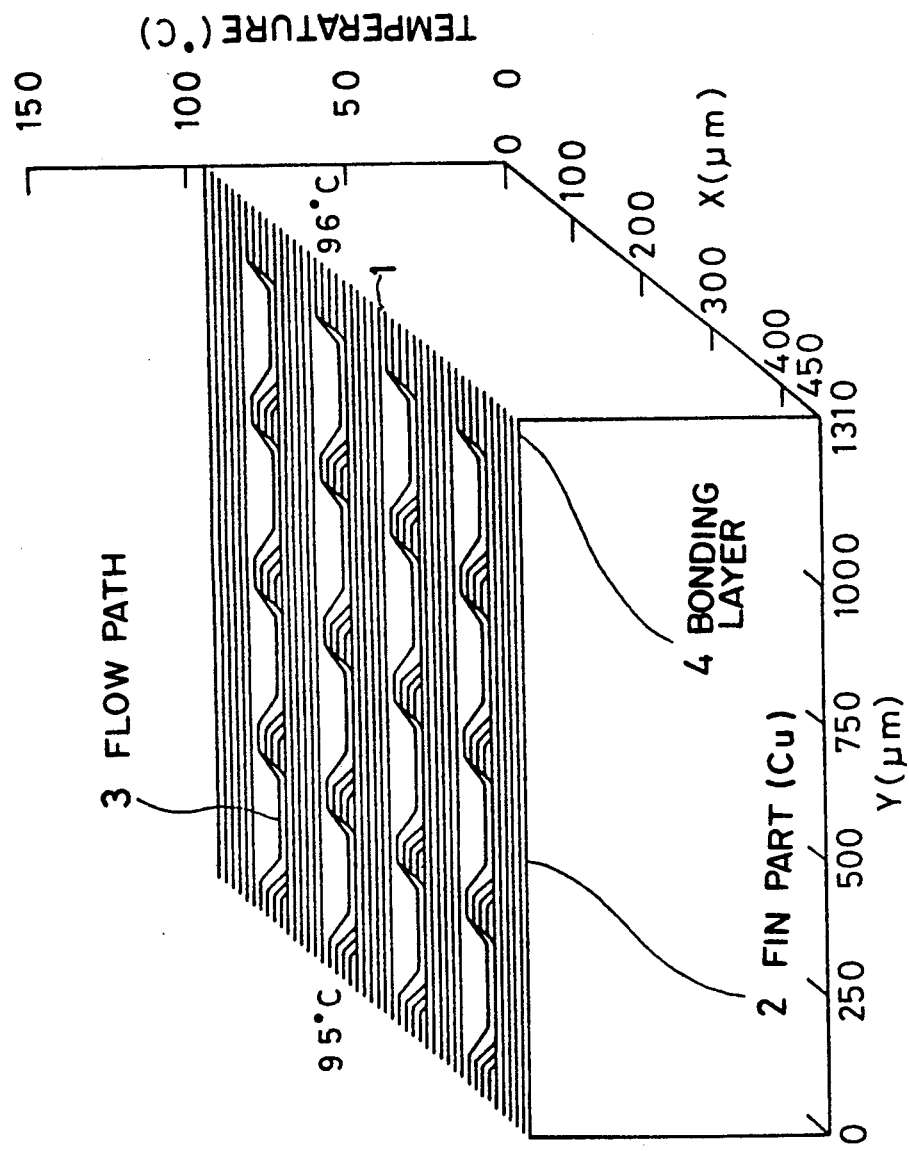
FIG. 8 is a scheme indicating an example of the temperature distribution in the fins having a microchannel structure made of air cooled copper using a bonding layer.

FIG. 8 shows another mode of realization using compressed air for the cooling medium, in which the other conditions are identical to those used in the example indicated in FIG. 6. Compressed air having a temperature of about 17° C. (pressure: about 5 kgf/cm$^2$) flows through the tube of the microchannels with a flow speed of about 24 m/s and the fins having a microchannel structure is made of Al. When the heat production within the semiconductor chip 1 is about 30 W/cm$^2$, the temperature at the surface of the semiconductor chip is kept at about 96° C. No lowering in the cooling capacity due to the insertion of the bonding layer of In is found. This is because the heat resistance to the heat conduction in the bonding layer of In is small with respect to the heat resistance to the heat conduction to the cooling medium flowing through the tube. Consequently, in the case of air cooling, any bonding material may be used, if it has a heat resistance, which is smaller than the heat resistance due to the thermal conductivity to the cooling medium, and adhesive materials such as epoxy resin, polyimide resin, silicone grease, etc. can be used usefully therfor.

Further not only Al and Cu but also any material may be used for the material for the fins, if it is a solid material, as indicated in FIG. 4.

TABLE 3

Heat resistance and equivalent thermal conductivity of fins having microchannels (per 1 cm$^2$ of area)

| Temperature of Water (°C.) | Material of Fins | Bonding Layer | Heat Resistance (K/W) | Equivalent Thermal Conductivity (W/cm$^2$.K) |
|---|---|---|---|---|
| (a) Water cooling (6 m/s) | | | | |
| 17 | Al | exist | 0.045 | 22.1 |
|    | Cu | exist | 0.037 | 26.6 |
| 10 | Al | exist | 0.046 | 21.7 |
|    | Cu | exist | 0.038 | 26.3 |
| (b) Air cooling (24 m/s) | | | | |
| 17 | Al.Cu | exist | 2.63 | 0.38 |

TABLE 3(a) indicates numerical values of the heat resistance (° C./W) and the quivalent thermal conductivity (W/cm$^2$·° C.) for 1 cm$^2$ of area viewed from the surface of the semiconductor chip obtained in the different modes of realization, when In (about 50 μm thick) is used for the bonding layer 4 and the temperature of water and the material of the fins are varied for a flow speed of about 6 m/s in the case of water cooling. In this TABLE, e.g. in the case where an In bonding layer (about 50 μm thick) and fins having a microchannel structure (4 stage type) made of Cu described above are used and water having a temperature of about 10° C. is made flow with a flow speed of about 6 m/s, a heat resistance of about 0.038 (° C./W) is obtained, when the cooling medium is viewed from the surface of the semiconductor chip. At this time, e.g. when the heat production in the semiconductor chip is about 100 W/cm$^2$, the temperature rise at the surface of the semiconductor chip from 10° C. is kept at about 3.8° C. If the temperature rise of the semiconductor chip from 10° C. should be maintained at about 85° C., a heat production of about 2200 W/cm$^2$ at the surface of the semiconductor chip is allowable.

TABLE 3(b) indicates numerical values of the heat resistance (° C./W) and the equivalent thermal conductivity (W/cm$^2$·° C.) per 1 cm$^2$ of area, when the cooling medium is viewed from the surface of the semiconductor chip obtained in the different modes of realization and the material of the fins is varied, in the case of air cooling (flow speed of about 24 m/s and compressed air of about 5 kgf/cm$^2$).

For Al and Cu, of which the fins are made, an almost identical heat resistance=about 2.63° C./W is obtained. For example, when the heat production at the surface of the semiconductor chip is about 1 W/cm$^2$, the temperature rise from 17° C. is kept at about 2.7° C. Further, if the temperature rise of the semiconductor chip from 17° C. should be maintained at about 85° C., a heat production of about 32 W/cm$^2$ in the semiconductor chip is allowable.

The semiconductor chip indicated in FIGS. 5 to 8 and TABLE 3 may be any kind and the effect can be obtained for any single element and LSI as a heat producing semiconductor element, as described previously.

In an embodiment indicated in FIG. 9, a heat diffusing layer 6 is added previously to the semiconductor chip jointed with the fins having a microchannel structure, so that transient thermal response is further improved in a part of an integrated circuit according to the present invention. In order to utilize the capacity of the fins having a microchannel structure as far as possible, it is efficient to dispose a heat current circuit diffusing rapidly heat produced locally within the semiconductor chip.

Although, in FIG. 9, a bipolar transistor is illustrated as an example of the semiconductor chip, the semiconductor chip may be a single semiconductor element or LSI using various sorts of semiconductor substrates made of Si, GaAs, InP, etc. such as an MOS type transistor, a bipolar type transistor, a semiconductor laser, a light emitting diode, etc. producing heat transiently and the effect can be obtained for all of them.

Taking an integrated bipolar type transistor as an example, heat is produced locally, in particular in the neighborhood of the region between the base 9 and the collector 10, within each of integrated transistor elements.

In FIG. 9, reference numeral 5 is a semiconductor substrate (Si in this example); 6 is a thermally highly conductive and electrically insulating layer; 7 is wiring (Al); 8 is an emitter; 9 is a base; 10 is a collector; and 11 is a depletion layer between the base and the collector.

Although any thermally highly conductive and electrically insulating layer 6 may be used, if it has a thermal conductivity as high as metals and it is electrically an insulator, e.g. AlN and BN are found suitable. Further, although, in FIG. 9, an example is shown, in which this thermally highly conductive and electrically insulating layer 6 is used uniformly in all the interlayer insulating layers and the passivation films, it has been used heretofore in a part of them. The effect can be obtained, also when it is used together with an $SiO_2$ film, an $Si_3N_4$ film, an $Al_2O_3$ film, etc.

Figure 10A:
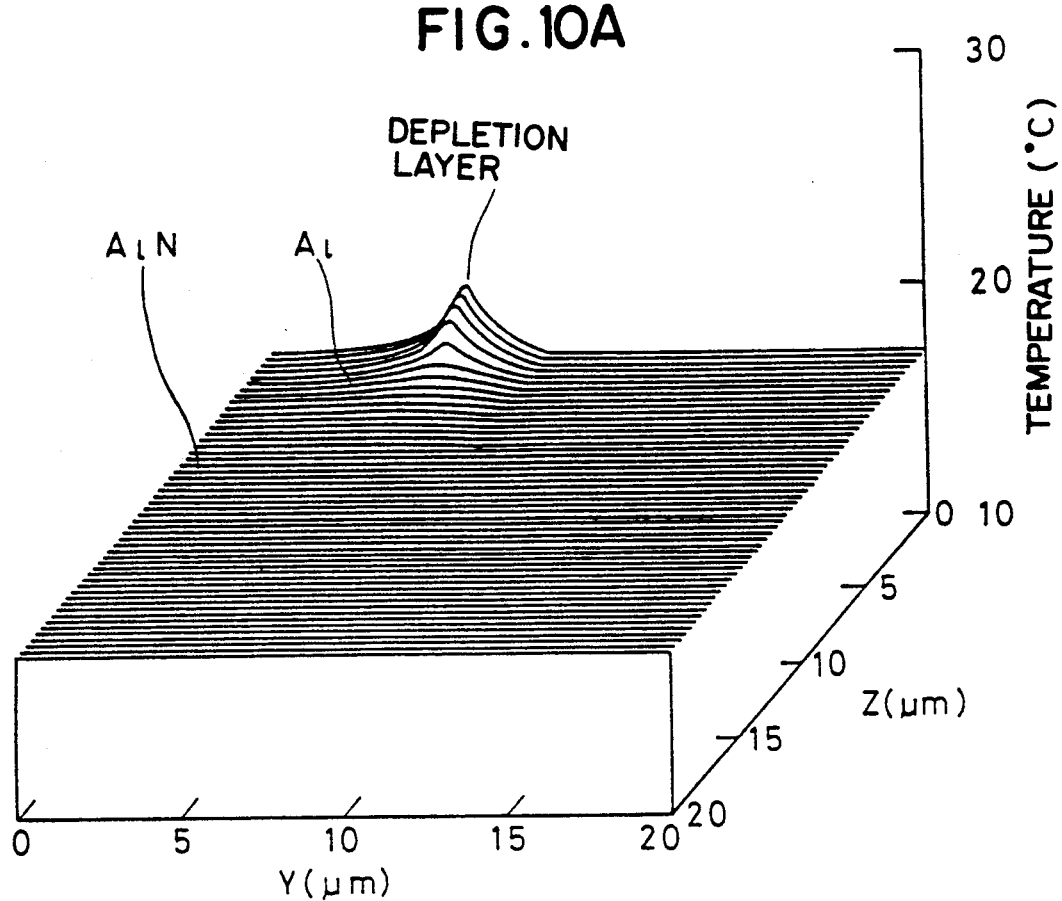
FIG. 10A and 10B are schemes indicating an example of the transient temperature distribution in the bipolar transistor having the heat diffusing structure.
Figure 10B:
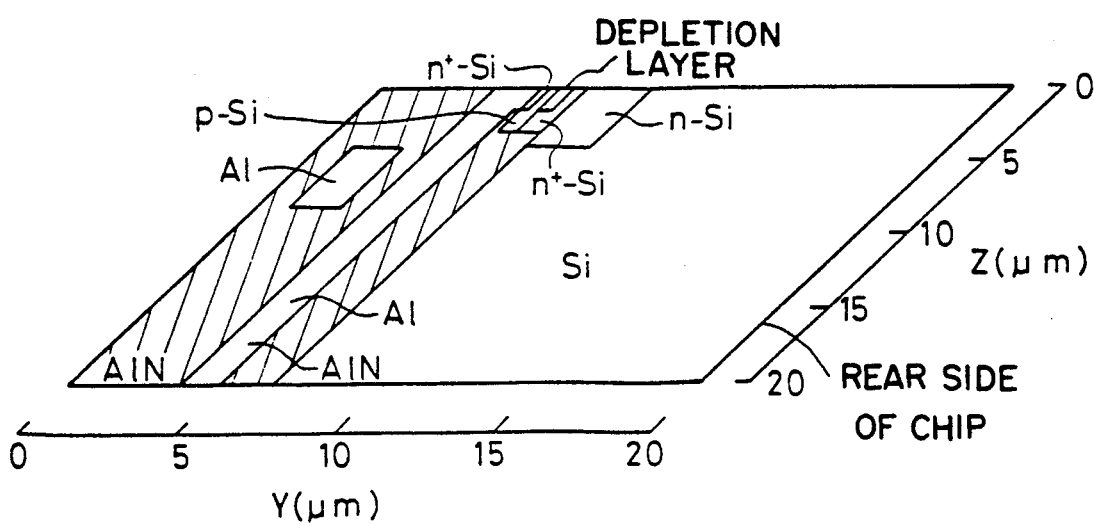

FIGS. 10A and 10B show a temperature distribution from the interior to the surface and a plan view of the device corresponding to the region, for which the temperature distribution is indicated, respectively, after about 5 $\mu$sec from a point of time, where current begins to flow, when one bipolar element consumes electric power of about 4 mW in the mode of realization indicated in FIG. 9, having the heat diffusing structure.

As indicated above, it can be understood that heat produced locally in the neighborhood of the depletion layer between the base and the collector is spread widely on the surface in a period of time as short as about 5 $\mu$sec in the construction having a thermally highly conductive and electrically insulating layer 6 serving as a heat diffusing structure. Heat is not spread so rapidly, widely and uniformly by using only interlayer insulating films and passivation films such as usual $SiO_2$ films, $Si_3N_4$ films, etc. having low thermal conductivities.

Figure 11:
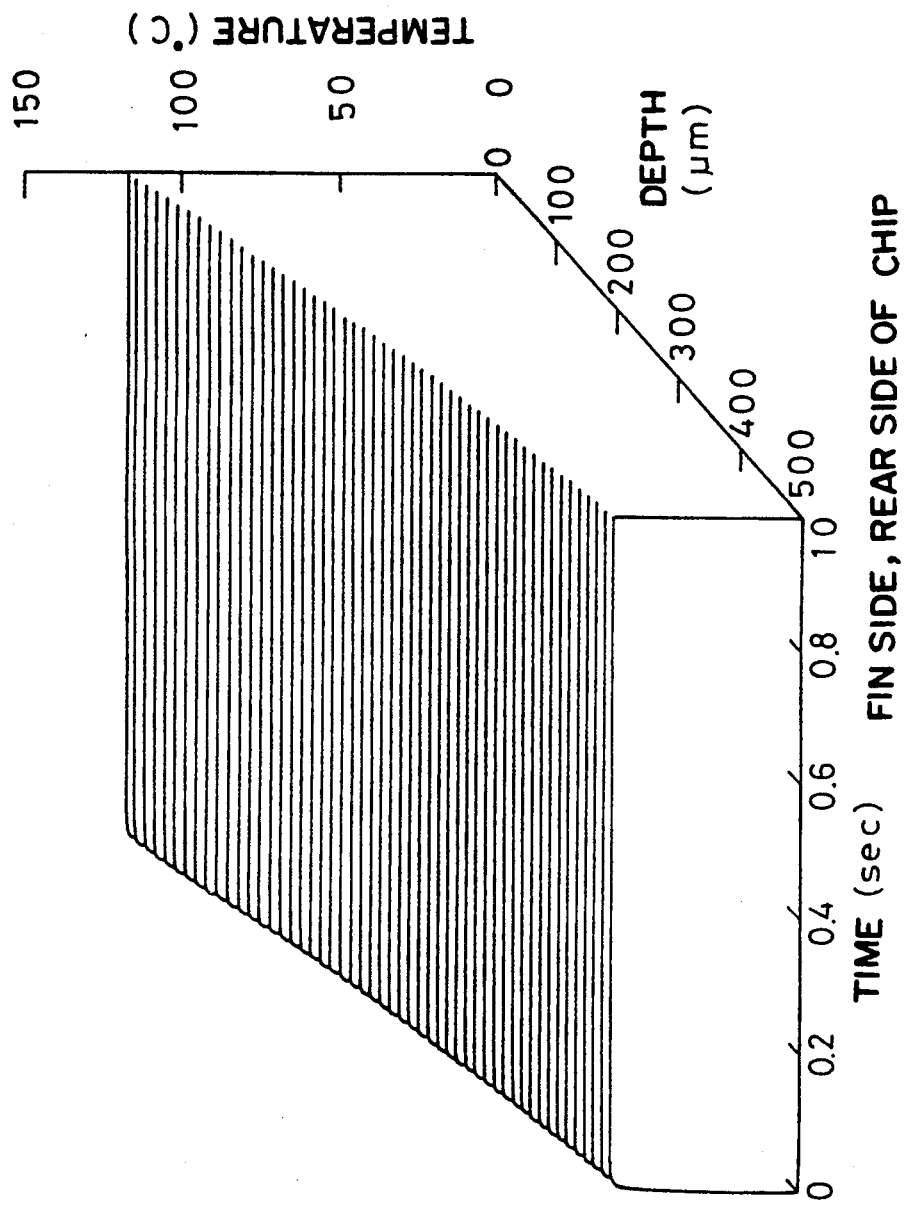
FIG. 11 is a scheme indicating an example of the temperature distribution, in the case where fins having a microchannel structure bonded to the rear side of a semiconductor chip having the heat diffusing structure on the front surface.

FIG. 11 indicates variations in the temperature in the case where fins having a microchannel structure are jointed to the rear side of a semiconductor chip having the heat diffusing structure indicated in FIG. 9.

In the semiconductor chip, e.g. a number of bipolar transistors as indicated in FIG. 9 are integrated and the temperature is measured, e.g. when heat of about 1500 W/cm$^2$ is produced in the interior as a whole. The fins having a microchannel structure are jointed to the rear side of the semiconductor chip by the direct bonding method under the conditions indicated in FIG. 2. A stationary temperature is achieved after a period of time of about 0.1 sec from the beginning of drive and the temperature is lower than about 120° C., i.e. the temperature is maintained approximately at the limit in practice.

Further, although it is not indicated in the figure, when the fins having a microchannel structure using a bonding layer under the conditions indicated in FIG. 6 are connected with the semiconductor chip indicated in FIG. 9 described above, if heat production in the semiconductor chip is about 1200W/cm$^2$, a stationary temperature is achieved similarly after a period of time of about 0.1 sec from the beginning of drive and the temperature is about 120° C., i.e. the temperature is maintained approximately at the limit in practice.

Figure 12:
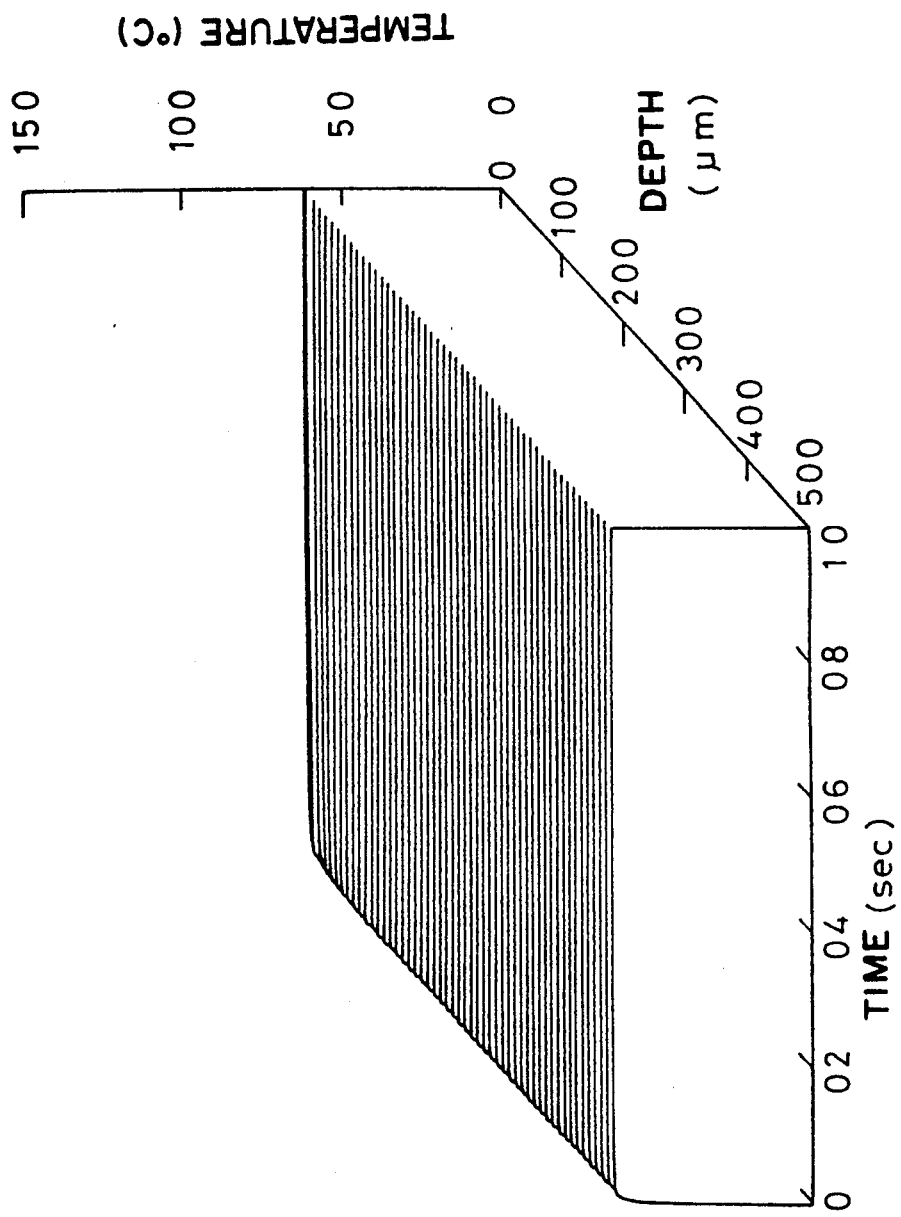
FIG. 12 is a scheme indicating an example of the temperature distribution, in the case where fins having a microchannel structure are bonded to the front side of a semiconductor chip having the heat diffusing structure on the front surface.

FIG. 12 indicates variations in the temperature in the case where fins having a microchannel structure are bonded to the front side of a semiconductor chip having the heat diffusing structure indicated in FIG. 9.

In the semiconductor chip, e.g. a number of bipolar transistors as indicated in FIG. 9 are integrated and the temperature is measured, e.g. when heat of about 1500 W/cm$^2$ is produced in the interior as a whole. The fins having a microchannel structure are jointed to the front side of the semiconductor chip by the direct bonding method under the conditions indicated in FIG. 2. A stationary temperature is achieved after a period of time of about 0.1 sec from the beginning of drive and the temperature is lower than about 65° C.

Further, although it is not indicated in the figure, when the fins having a microchannel structure using the bonding layer indicated in FIG. 6 are connected with the front surface of the semiconductor chip having the heat diffusing structure indicated in FIG. 9, if heat production in the semiconductor chip is about 1500 W/cm$^2$, a stationary temperature is achieved similarly after a period of time shorter than about 0.01 sec from the beginning of drive and the temperature is lower than about 85° C. Further, owing to the fact that the fins having a microchannel structure is bonded to the front surface side, as clearly seen from FIG. 12, a uniform temperature distribution is kept from the front surface of the semiconductor chip to the interior and further to the rear surface and it is possible to reduce remarkably influences of thermal stress.

Figure 13:
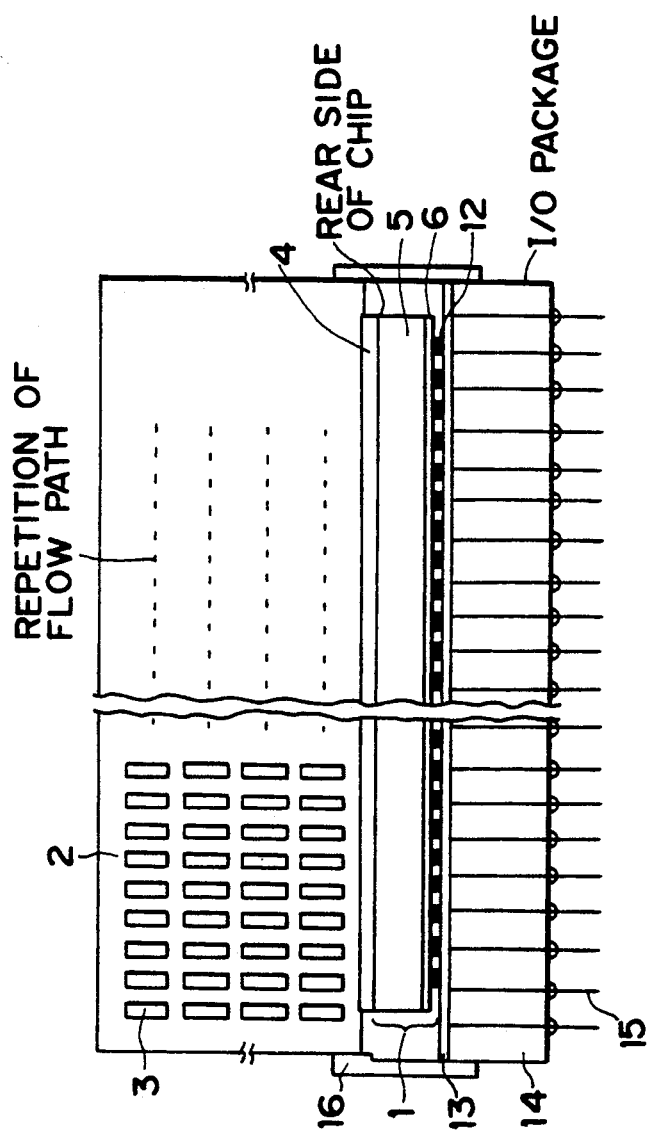
FIG. 13 is a scheme indicating an embodiment of the fins having a microchannel structure according to the present invention mounted in a package.

FIG. 13 shows an embodiment of a whole I/O package, in which the fins having a microchannel structure 2 are mounted on the rear side of the semiconductor chip 1. There exist a number of working regions producing heat in the interior on the front side of the semiconductor chip 1 and there is disposed a thermally highly conductive and electrically insulating layer 6 for spreading rapidly heat produced locally and transiently, the effect thereof being indicated in FIG. 9. The fins having a microchannel structure are bonded to the rear side of the chip by an adhesive layer 4, as described in the embodiments indicated in FIGS. 5 to 8 and TABLE 3. Or, although it is not indicated in the figure, the rear side surface of the semiconductor chip 1 and the fins having a microchannel structure 2 may be jointed by the direct bonding method, as indicated in FIGS. 1 to 4, TABLE 2 and FIG. 9.

Although the size and the number of stages of the flow paths in the fins having a microchannel structure 2 can be determined, depending on the object, a more remarkable effect can be obtained by decreasing the size and increasing the number of stages in a region usable in practice.

In a typical example, as indicated in FIGS. 1 and 5, e.g. the cross section of the flow path of each of the channels about 1 cm long is 50 μm×250 μm and different channels are sectioned by a wall about 50 μm thick, the channels being arranged horizontally over about 1 cm in 4 stages.

The size of about 1 cm described above is a size, which is matched approximately with the area of the semiconductor chip, and it may be varied, depending on the size of the chip. Consequently the thickness of the chip 1, a higher heat evacuation efficiency is obtained with decreasing thickness. Usually it is 350 μm to 450 μm, but it is desirable that it is smaller than about 50 μm.

As described above, by using a multistage structure of fine microchannel flow paths it is possible to realize a small construction having an extremely high heat evacuation efficiency and capable of being mounted on one chip. In addition it can be formed together with an I/O pin package in one body.

For the I/O pin package described above the material for the package substrate may be either one of $Al_2O_3$, AlN, BN, SiC, etc. However AlN and BN, which have high thermal conductivities, are the most suitable. I/O pins 15 are connected with I/O terminals of the semiconductor chip by a solder bump array 12 through a wiring layer 13.

Further, although, in the present embodiment, a case where there is only one semiconductor chip 1, a plurality of chips may be assembled in one body, depending on the object.

Figure 14:
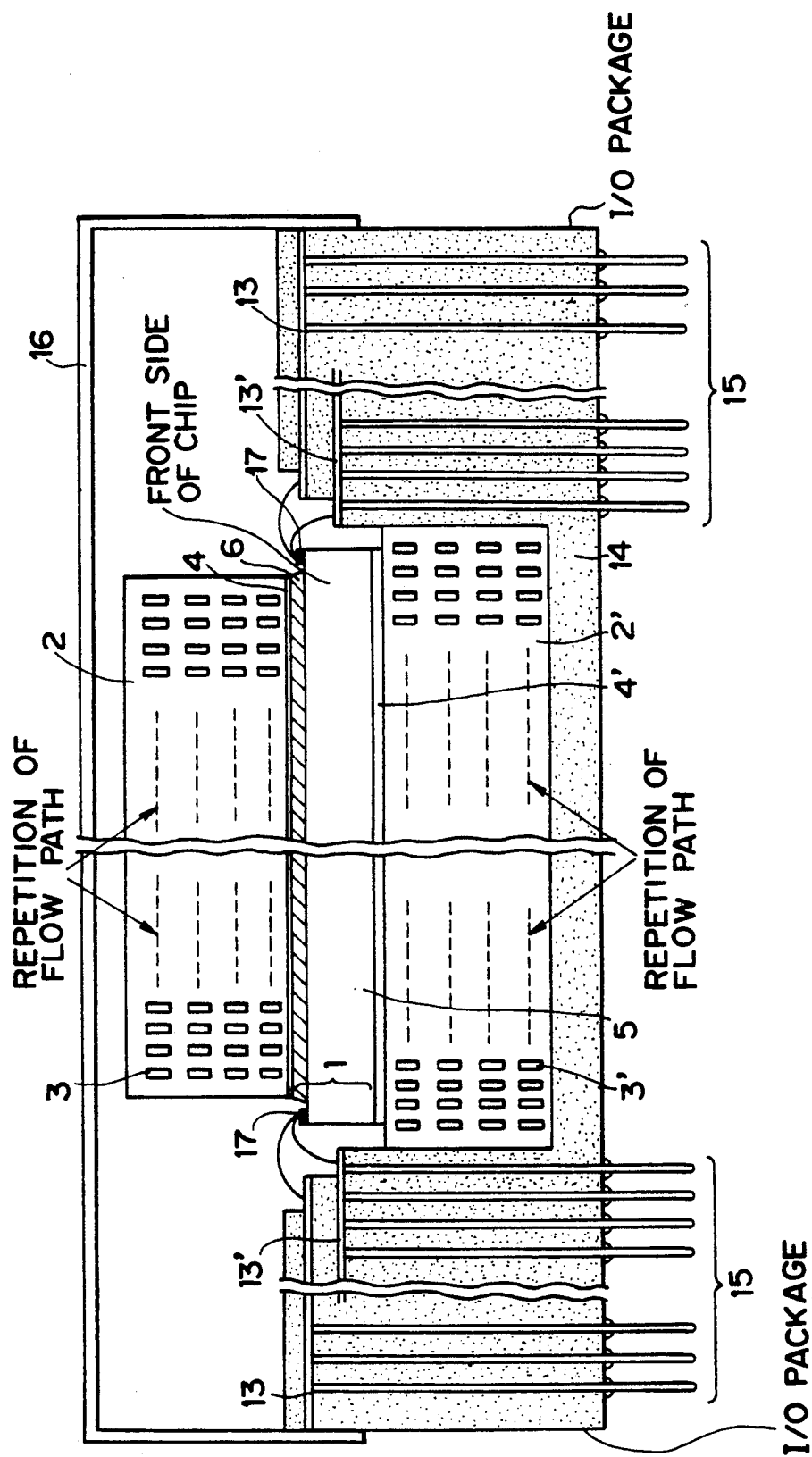
FIG. 14 is a scheme indicating another embodiment of the fins having a microchannel structure according to the present invention mounted in a package.
Figure 15:
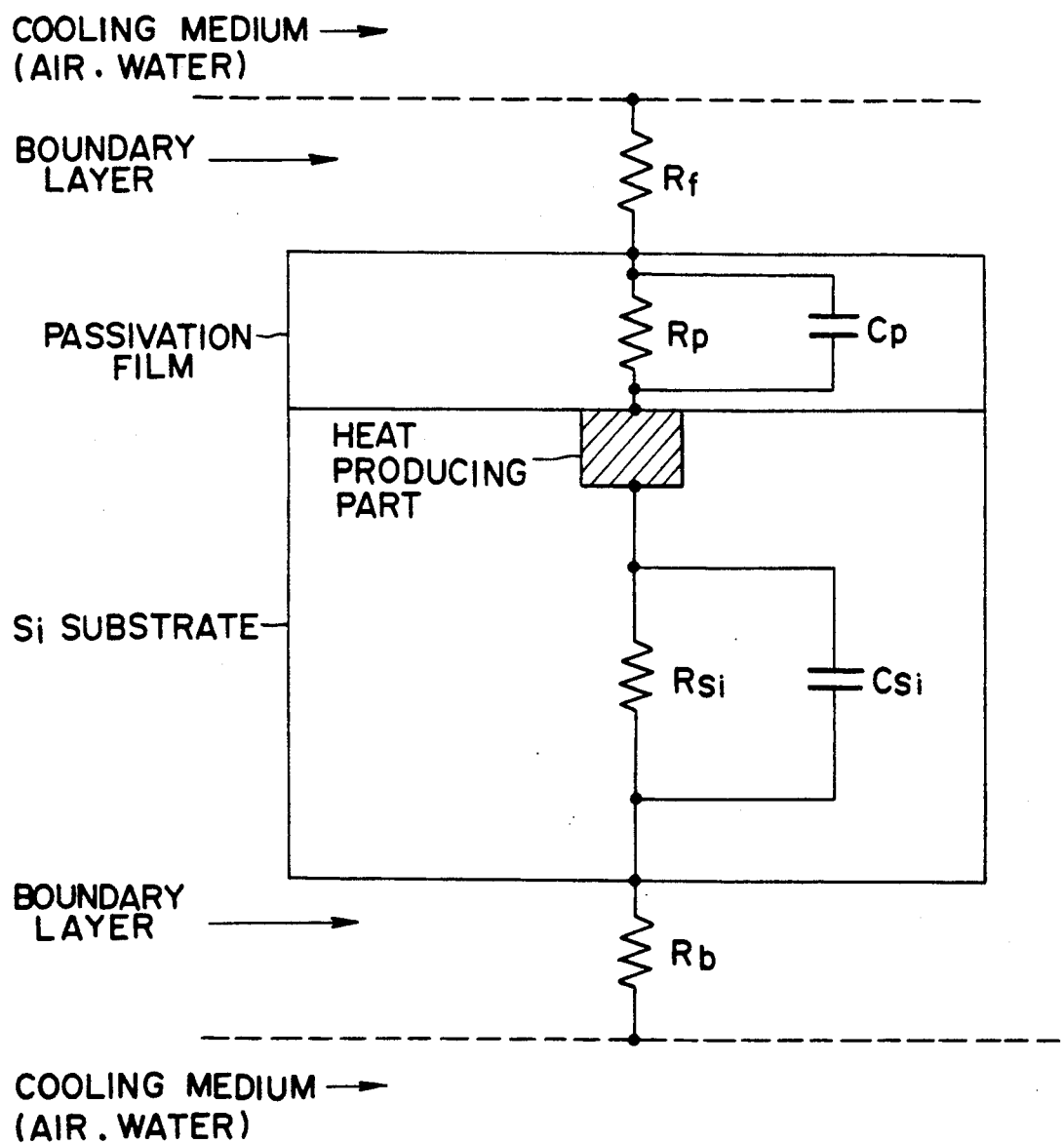
FIG. 15 is a scheme for explaining a prior art heat current circuit in an integrated circuit.
Figure 16A:
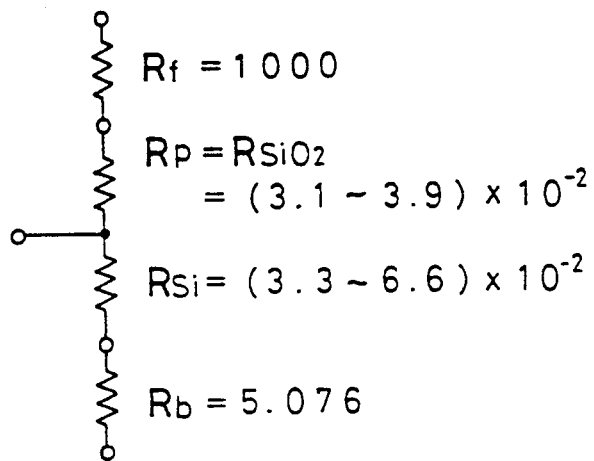
FIGS. 16A and 16B are equivalent circuits of the heat current circuit indicated in FIG. 15.
Figure 16B:
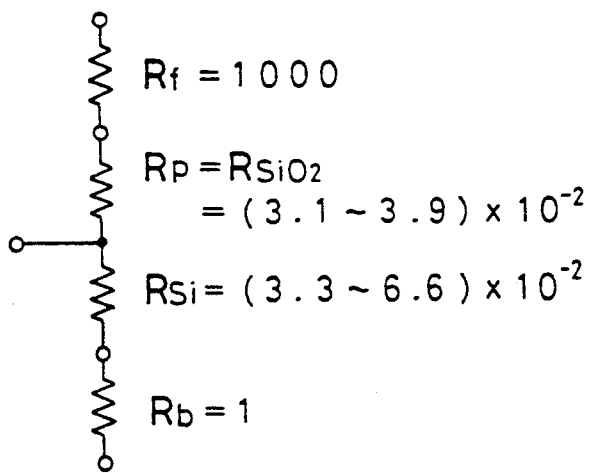

FIG. 14 shows an embodiment representing a whole I/O package, in which fins having a microchannel structure 2 and 2' are mounted on both the sides of the semiconductor chip 1. There exist a number of working regions producing heat in the interior on the front side of the semiconductor chip 1 and there is disposed a thermally highly conductive and electrically insulating layer 6 for spreading rapidly heat produced locally and transiently, the effect thereof being indicated in FIG. 9. The fins having a microchannel structure are bonded to the front side of this insulating layer 6 by a bonding layer 4, as described in the embodiments indicated in FIGS. 5 to 8 and TABLE 3.

Or, although it is not indicated in the figure, the semiconductor chip 1 may be jointed by the direct bonding method, as indicated in FIGS. 1 to 4, TABLE 2 and FIG. 12. Further the fins having a microchannel structure 2' is jointed through a bonding layer 4' to the rear side of the semiconductor chip 1, as indicated in FIGS. 5 to 8 and TABLE 3. Or, although it is not indicated in the figure, the fins having a microchannel structure 2' may be jointed with the rear side of the semiconductor chip 1 by direct bonding method, as indicated in FIGS. 1 to 4, TABLE 2 and FIG. 11.

The construction of the fins having a microchannel structure 2 and 2' is almost identical to that described, referring to FIGS. 1, 5 and 13.

The material for the package substrate 14 for the I/O pin package is the same as described, referring to FIG. 13.

The I/O pins 15 are connected through multilayered wiring layers 13 and 13' and wire-bonded with bonding pads 17 on the chip 1. After package assembling, the whole device is sealed finally with a package sealing cap 16.

Concerning the thickness of the chip 1, a higher heat evacuation efficiency is obtained with decreasing thickness. Usually it is 350 μm to 450 μm, but it is desirable that it is smaller than about 50 μm. As described above, it is possible to joint fins having a fine microchannel structure to both the sides of the chip and in addition they can be formed together with an I/O pin package in one body.

By constructing the heat evacuating body by fins having a microchannel structure bonded to both the sides, a heat evacuation efficiency can be obtained, which is about two times as high as that obtained by the construction using the fins having a microchannel structure bonded only on the front side or the rear side. Further this structure has heat evacuating characteristics excellent in the transient thermal response.

Furthermore, although, in the example indicated in FIG. 14, a case where there is only one semiconductor chip 1 is indicated, a plurality of chips may be assembled in one body, depending on the object.

As clearly seen from the above explanation, according to the present invention, it is possible to obtain a heat evacuation efficiency, which is about 10 to 100 times as high as that obtained by using usual fins, and to realize the heat evacuating body formed together with an I/O pin package in one body by disposing fins having a microchannel structure including multistage fine microchannel flow path structure on a semiconductor element. Further a more remarkable effect can be obtained by using them together with a heat diffusing structure making local heat production within the semiconductor element uniform. Consequently it is possible to realize an electronic circuit capable of dealing with increase in the integration density, the electric power consumption and the drive speed and thus to improve significantly the performance of the semiconductor device.

What is claimed is:

1. A semiconductor element comprising:
   a semiconductor chip; and
   a fin body having a microchannel structure bonded to a predetermined surface of said semiconductor chip, in which a plurality of microchannel flow paths are formed, said microchannel structure including a predetermined number of stages which each include at least one of said flow channels and which are arranged successively in a direction substantially perpendicular to said predetermined surface.

2. A semiconductor element according to claim 1 wherein said fin body is directly bonded to said semiconductor chip.

3. A semiconductor element according to claim 1 wherein said fin body is bonded to said semiconductor chip through an adhesive layer.

4. A semiconductor element according to claim 1 wherein liquid serving as a cooling medium is supplied to said microchannel flow paths formed in said fin body.

5. A semiconductor element according to claim 1 wherein gas serving as a cooling medium is supplied to said microchannel flow paths formed in said fin body.

6. A semiconductor element according to claim 1 wherein said fin body is made of a material, which is different from a material, of which said semiconductor chip is made.

7. A semiconductor element according to claim 1 wherein the cross section of each of said microchannel flow paths formed in said fin body is smaller than about 1 mm².

8. A semiconductor element according to claim 1 wherein said fin body is combined with an I/O pin package in one body.

9. A semiconductor element according to claim 1 wherein at least one heat diffusing layer is formed in said semiconductor chip.

10. A semiconductor element according to claim 1 wherein said fin body is bonded to the surface at a place close to working regions in said semiconductor chip.

11. A semiconductor element according to claim 9 wherein said heat diffusing layer is a thermally highly conductive and electrically insulating layer.

12. A semiconductor element according to claim 1 including a further fin body bonded to a further surface of said semiconductor chip and having formed therein a plurality of microchannel flow paths.

13. A semiconductor element according to claim 1, wherein said predetermined number of said stages is four.

14. A semiconductor element according to claim 11, wherein the material of said heat diffusing layer is AlN.

15. A semiconductor element comprising:
   a semiconductor chip including circuit elements and at least one heat diffusing layer, some of said circuit elements in said semiconductor chip being formed as a unit with said heat diffusing layer; and
   a fin body having a microchannel structure bonded to a predetermined surface of said semiconductor chip, in which a plurality of microchannel flow paths are formed.

16. The semiconductor element according to claim 15, wherein the microchannel structure includes a predetermined number of stages which each include at least one of said flow channels and which are arranged successively in a direction substantially perpendicular to said predetermined surface.

17. The semiconductor element according to claim 16, wherein said predetermined number of said stages is four.

18. A semiconductor element according to claim 15, wherein said fin body is directly bonded to said semiconductor chip.

19. A semiconductor element according to claim 15, wherein said fin body is bonded to said semiconductor chip through an adhesive layer.

20. A semiconductor element according to claim 15, wherein liquid serving as a cooling medium is supplied to said microchannel flow paths formed in said fin body.

21. A semiconductor element according to claim 15, wherein gas serving as a cooling medium is supplied to said microchannel flow paths formed in said fin body.

22. A semiconductor element according to claim 15, wherein said fin body is made of a material which is different from a material of which said semiconductor chip is made.

23. A semiconductor element according to claim 15, wherein the cross section of each of said microchannel flow paths formed in said fin body is smaller than about 1 mm².

24. A semiconductor element according to claim 15, wherein said fin body is combined with an I/O pin package in one body.

25. A semiconductor element according to claim 15, wherein said fin body is bonded to the surface at a place close to working regions in said semiconductor chip.

26. A semiconductor element according to claim 15, wherein said heat diffusing layer is a thermally highly conductive and electrically insulating layer.

27. A semiconductor element according to claim 15, including a further fin body bonded to a further surface of said semiconductor chip and having formed therein a plurality of microchannel flow paths.

28. A semiconductor element according to claim 15, wherein the material of said diffusing layer is AlN.

29. A semiconductor element comprising:
   a semiconductor chip;
   a pair of fin bodies respectively bonded to opposed surfaces of said semiconductor chip, each of said fin bodies having therein a microchannel structure including a predetermined number of stages which are arranged successively in a direction perpendicular to the surface of said semiconductor chip to which the fin body is bonded and which each include at least one flow channel; and
   a predetermined number of pins electrically connected to a circuit formed on said semiconductor chip.

* * * * *